United States Patent
Choi et al.

(10) Patent No.: US 7,602,171 B2
(45) Date of Patent: Oct. 13, 2009

(54) SYSTEM FOR TESTING MEMORY MODULES USING A ROTATING-TYPE MODULE MOUNTING PORTION

(75) Inventors: Sun Choi, Asan-si (KR); Dong-soo Lee, Seoul (KR); Yong-kyun Sun, Cheonan-si (KR); Hyun-ho Kim, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 365 days.

(21) Appl. No.: 11/518,981

(22) Filed: Sep. 12, 2006

(65) Prior Publication Data

US 2007/0079187 A1 Apr. 5, 2007

(30) Foreign Application Priority Data

Sep. 13, 2005 (KR) ...................... 10-2005-0085208

(51) Int. Cl.
*G01R 31/28* (2006.01)
*G11C 29/00* (2006.01)
(52) U.S. Cl. ..................... 324/158.1; 714/718; 714/724
(58) Field of Classification Search ................. 714/718, 714/724; 365/201; 324/158.1, 537, 760, 324/763–765
See application file for complete search history.

(56) References Cited

U.S. PATENT DOCUMENTS 3,576,102 A * 4/1971 West ........................... 60/602
5,617,945 A * 4/1997 Takahashi et al. ......... 198/471.1
5,894,217 A    4/1999 Igarashi et al.
5,920,192 A * 7/1999 Kiyokawa ................. 324/158.1
6,129,428 A * 10/2000 Helwig et al. ............... 312/114
6,246,251 B1 * 6/2001 Gallagher .................... 324/765
6,304,093 B1 * 10/2001 Hilmoe et al. ............... 324/760
6,967,475 B2 * 11/2005 Tsui et al. ................. 324/158.1
7,129,694 B2 * 10/2006 Brunner et al. .......... 324/158.1
7,435,046 B2 * 10/2008 Kiaie et al. ............ 414/223.01
2005/0162151 A1 * 7/2005 Tsui et al. ................. 324/158.1

FOREIGN PATENT DOCUMENTS

| JP | 08-304509 | 11/1996 |
|---|---|---|
| JP | 2002-340962 | 11/2002 |
| KR | 1999-026542 | 4/1999 |
| KR | 2000-0052405 | 8/2000 |
| KR | 2003-0042310 | 5/2003 |

* cited by examiner

*Primary Examiner*—Cynthia Britt
(74) *Attorney, Agent, or Firm*—Lee & Morse, P.C.

(57) ABSTRACT

A system for testing memory modules having a rotating-type board mounting portion with a plurality of mounting surfaces positioned at different planes and connected around an axis to form a rotatable structure, at least one circuit board mounted on each mounting surface, an input/output portion, a rotational motor coupled to a rotational shaft for rotating the rotatable structure, and a central controller electrically connected to the circuit boards.

19 Claims, 9 Drawing Sheets

SYSTEM FOR TESTING MEMORY MODULES USING A ROTATING-TYPE MODULE MOUNTING PORTION

BACKGROUND OF THE INVENTION

1. Field of the Invention

The present invention relates to semiconductor testing equipment. In particular, the present invention relates to a memory module testing system having a rotating-type mounting portion for loading and simultaneously testing a plurality of memory modules.

2. Description of the Related Art

In general, semiconductor devices may include, inter alia, one or more memory modules, while each memory module may contain an array of volatile and/or nonvolatile memory chips. The memory modules may be tested prior to integration into the semiconductor devices to determine proper operation and lack of defects. Such testing may include incorporating memory modules into testing devices and running a test to determine whether the memory modules, as well as their memory chips, are functional.

A device for testing memory modules may be an apparatus that employs memory modules, e.g., a server, a computer, and so forth, and may be capable of performing such testing on a plurality of memory modules, e.g., performing simultaneous testing of a plurality of circuit boards or motherboards having memory modules integrated therein.

Simultaneous testing of a plurality of circuit boards may include, for example, an array of testing devices, e.g., three testing devices arranged in a row, each having several rows of circuit boards. The testing may be controlled by several operators that operate the array of testing devices. For example, a first operator may load memory modules into circuit boards, a second operator may insert the circuit boards into the testing device, a third operator may remove the circuit boards from the testing device, and a fourth operator may unload the memory modules from the circuit boards.

However, such methods of memory modules testing may require a large space due to the plurality of testing devices employed, thereby reducing workspace efficiency. Additionally, such methods may employ a large number of operators that are limited to specific operating tasks, thereby reducing time and manpower efficiency, e.g., once an operator completes one task, he or she may wait for all tasks in all testing devices to be completed before being able to begin the next task. Similarly, once all testing devices complete testing, no further actions may be taken until an operator begins the next task.

Accordingly, there remains a need for an apparatus capable of testing memory modules, while providing enhanced efficiency in terms of space, time, and manpower.

SUMMARY OF THE INVENTION

The present invention is therefore directed to a system for testing memory modules, which substantially overcomes one or more of the problems due to the limitations and disadvantages of the related art.

It is therefore a feature of an embodiment of the present invention to provide a system capable of providing simultaneous testing of a plurality of memory modules in a shorter time period.

It is another feature of an embodiment of the present invention to provide a system capable of employing reduced space and manpower.

At least one of the above and other features of the present invention may be realized by providing a system for testing memory modules having a board mounting portion including a plurality of mounting surfaces positioned at different planes and connected around an axis to form a rotatable structure, each mounting surface including at least one circuit board, an input/output portion, a rotational motor coupled to a rotational shaft to rotate the rotatable structure, and a central controller electrically connected to the circuit boards.

The central controller and the circuit boards may be electrically connected via at least one mercury contact slip ring, and the input/output portion may include a test result indicator electrically connected to the central controller, a loading portion, and an unloading portion.

The rotational shaft of the present invention may be the axis of the rotatable structure.

The mounting surfaces of the inventive system may be connected to form a polyhedral tower around the axis; the axis being perpendicular to a surface the system is placed on. The polyhedral tower may be any one of a hexahedron, an octahedron, a decahedron, and a prism. Additionally, each mounting surface may include three circuit boards.

The mounting surfaces of the inventive system may also be connected radially around the axis; the axis being parallel to a surface the system is placed on. Additionally, each mounting surface may include two circuit boards.

The testing system of the present invention may further include a plurality of hot air blowers, having each hot air blower coupled to one of the plurality of mounting surfaces, a robotic arm for moving memory modules between the input/output portion and the board mounting portion, and a display window formed in the input/output portion, the display window is capable of displaying at least one mounting surface, such that the rotatable structure is capable of sequentially displaying each of the plurality of the mounting surfaces through the display window.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
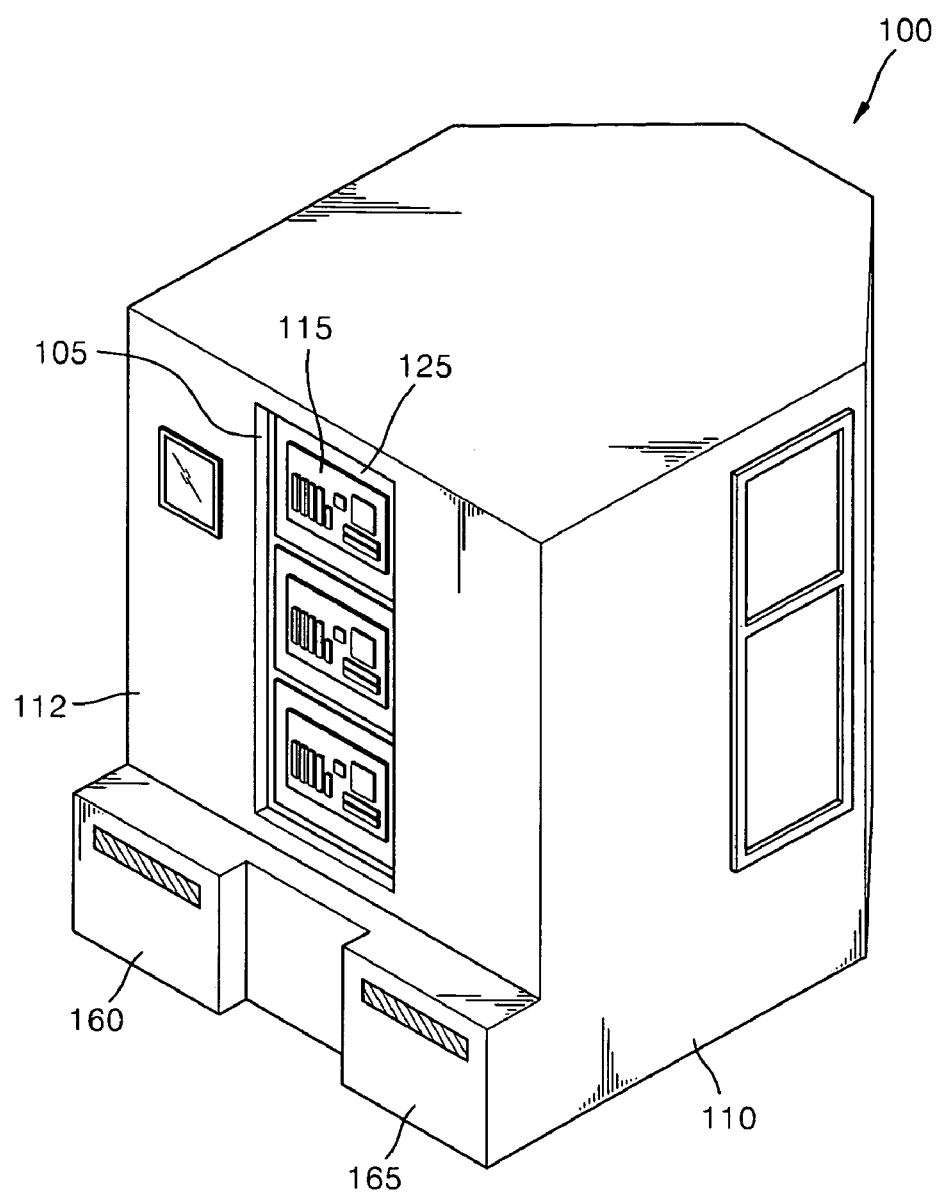
FIG. 1 illustrates a schematic perspective view of a system for testing memory modules according to an embodiment of the present invention.

Korean Patent Application No. 10-2005-0085208, filed on Sep. 13, 2005, in the Korean Intellectual Property Office, and entitled: "System for Testing Memory Modules using Rotating-Type Module Mounting Portion," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers, elements, and regions may be exaggerated for clarity of illustration. It will also be understood that when an element is referred to as being "on" another an element or substrate, it can be directly on the other element or substrate, or intervening elements may also be present. Further, it will be understood that when an element is referred to as being "under" another element, it can be directly under, or one or more intervening elements may also be present. In addition, it will also be understood that when an element is referred to as being "between" two elements, it can be the only element between the two elements, or one or more intervening an elements may also be present. Like reference numerals refer to like elements throughout.

An exemplary embodiment of the present invention, i.e., system 100 for testing memory modules having a plurality of volatile and/or nonvolatile memory chips, will be described with reference to schematics of perspective and planar views illustrated in FIGS. 1-2, respectively.

The testing system 100 of the present invention may include a board mounting portion 120 with a plurality of mounting surfaces 125, whereas at least one circuit board 115 may be mounted on each mounting surface 125. The testing system 100 may also include a loading portion 160 that may be used for depositing memory modules to be tested, an unloading portion 165 that may be used for depositing tested memory modules, a central controller 140 for controlling the circuit boards, a rotational motor 130 to rotate the board mounting portion 120, a rotational shaft 135 coupled to the rotational motor 130, and a display window 105 that may display at least one mounting surface 125. The display window 105, the loading portion 160, and the unloading portion 165 may be referred collectively hereinafter as the input/output portion 112 of system 100. A chamber 110 may enclose all the components included in testing system 100, while the front section of chamber 110 may include the input/output portion 112, as illustrated in FIGS. 1-2.

The input/output portion 112 may further include a test result indicator 150 to indicate tested memory modules for the operator. The test result indicator 150 may correspond either to the memory modules or to the mounting surfaces 125, e.g., test result indicator 150 may be electrically connected either to each circuit board 115 or to each mounting surface 125, by any means known in the art, such as a plurality of light emitting diodes (LEDs).

The board mounting portion 120 may include a plurality of mounting surfaces 125 that are positioned at different planes and connected around an axis to form a rotatable structure, i.e., a structure that may include a plurality of surfaces that are connected to form a three-dimensional, regular or irregular shape such that the plurality of surfaces may be rotated either simultaneously or separately around one axis. An example of a rotatable structure may be a polyhedral tower. The rotational structure may provide rotational capabilities to the board mounting portion 120, thereby imparting easy access to each mounting surface 125. As illustrated in FIG. 2, a board mounting portion 120 may have twelve mounting surfaces 125 that may form a dodecagon. Alternatively, the board mounting portion 120 may have mounting surfaces 125 that may form any polyhedral tower, such as a tetrahedron, pentahedron, hexahedron, octahedron, and so forth, as shown in FIG. 3. Polyhedral structures may be advantageous in minimizing the space required for a testing system, while providing an increased number of memory modules tested at a time.

As further illustrated in FIG. 3, each mounting surface 125 may include at least one circuit board 115, and preferably at least three circuit boards 115. The circuit boards may be arranged vertically on each mounting surface 125, such that display of one mounting surface 125 may display at least one circuit board 115, and preferably at least three circuit boards 115. Each circuit board 115 may be set to integrate therein at least one memory module for testing, whereas the memory module may be deposited through the loading portion 160.

Accordingly, each circuit board 115 may include a socket for holding the memory modules (not shown) and circuit lines (not shown) to test the memory modules placed in the testing socket. The socket of the circuit board 115 may have at least one bank, and, more preferably, at least two banks, such that one memory module may be placed in one bank. If the circuit board 115 is, for example, a motherboard of a computer system, it may also include a central processing unit (not shown).

The input/output portion 112 of system 100 may be employed to load and unload memory modules into the testing system, and to provide a monitoring zone for the operator. The operator may manually use the load/unload portions 160 and 165 to facilitate integration of memory modules into circuit boards, while the rotation of the board mounting portion 120 may allow easy loading of the entire system. The display window 105 may be constructed to display at least one mounting surface 125, thereby providing a display of at least three circuit boards 115. Accordingly, each time the board mounting portion 120 is rotated, at least three circuit boards 115 may be observed by an operator. As such, the plurality of circuit boards 115 may be sequentially moved in front of the standing operator, thereby reducing the operator's movement, reducing the number of required operators, and increasing work efficiency.

The rotational motor 130 of the present invention may provide the rotational capabilities of board mounting portion 120. The rotational motor 130 may have a structure known to those skilled in the art, and may provide a rotational force to the rotational shaft 135 to facilitate rotation of the board mounting portion 120. The rotational motor 130 may rotate the board mounting portion 120 about a rotational shaft 135, such that the mounting surfaces 125 may simultaneously rotate as well, thereby providing room for placing additional memory modules for testing. It should also be noted that the rotational motor 130 may be located either inside chamber 110 or outside of chamber 110. When the rotational motor 130 is located outside chamber 110, the rotational force may be delivered to the rotational shaft 135 through a separate rotation delivery shaft (not shown). For example, the rotational shaft 135 may be coupled to the board mounting portion 120 and thereby-to the mounting surfaces 125. In other words, the mounting surfaces 125 may be coupled to a baseplate (not shown) that may be coupled to the rotational shaft 135 as well. Alternatively, each individual mounting surface 125 may be coupled to the rotational shaft 135, such that the rotational shaft 135 may be formed perpendicularly to the bottom of chamber 110, thereby facilitating the rotation of the board mounting portion 120 in response to the rotational shaft 135 movement.

The rotational shaft 135 may be a center axis that rotates the board mounting portion 120. It should be noted, however, that regardless of the structure formed by connecting the mounting surfaces 125 into a rotatable structure, there may be one rotational shaft for the structure, as illustrated in FIG. 2.

The central controller 140 of the inventive system 100 may be a computer system or a server electrically connected to the circuit boards 115, and it may operate the circuit boards 115 to facilitate testing of the memory modules. For example, the central controller 140 may control the central processing unit of each circuit board 115, while the central processing unit may control the power supply and the hard disk of the circuit board 115. Alternatively, the central controller 140 may control a group of circuit boards 115.

In addition, the central controller 140 may operate the rotational motor 130, and thereby control the rotational speed of the rotational motor 130 to correspond to the test time of each memory module. For example, when the test time of the memory module is short, the central controller 140 may increase the rotational speed of the rotational motor 130 to reduce the standby time of the tested memory module. Such speed adjustments may increase the efficiency of the memory module testing.

Figure 2:
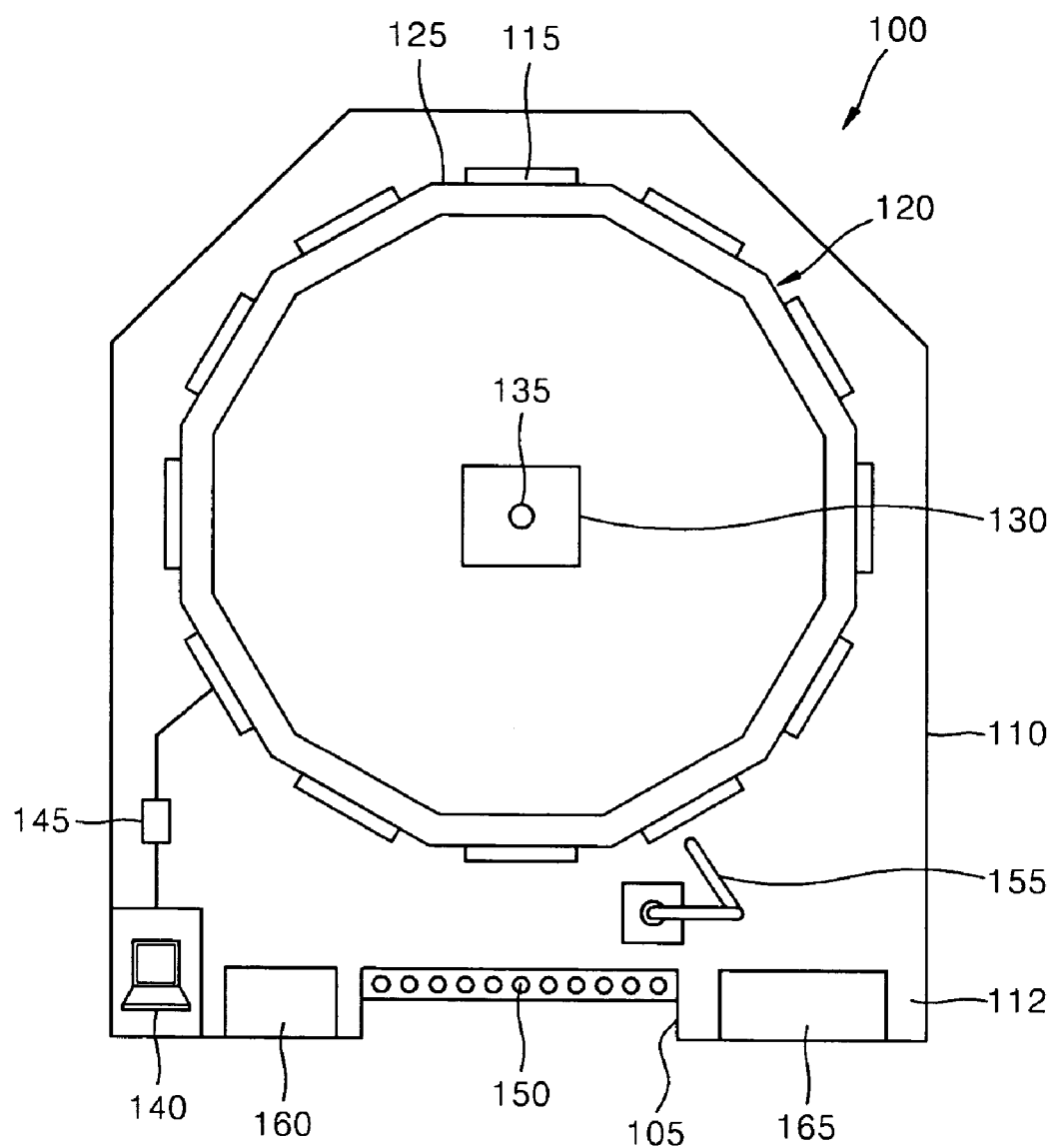
FIG. 2 illustrates a schematic plan view of the testing system in FIG. 1.
Figure 3:
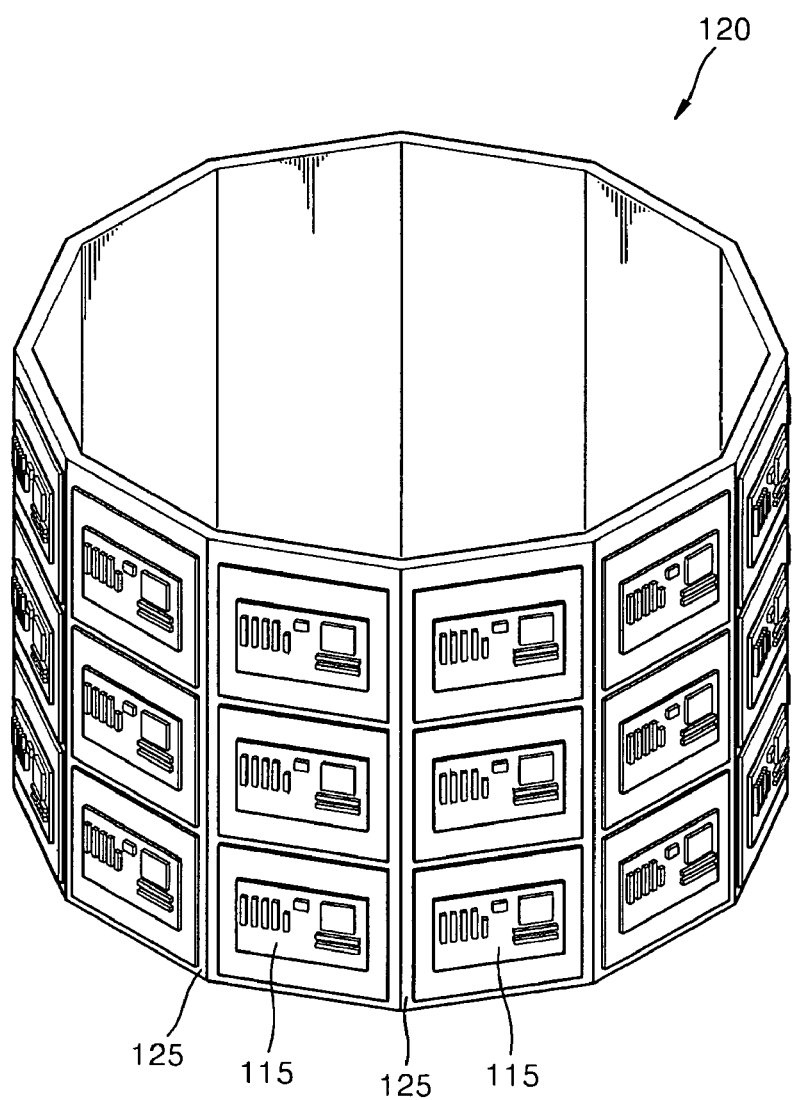
FIGS. 3 and 4 illustrate schematic perspective views of a board mounting portion of the testing system in FIG. 1.
Figure 5:
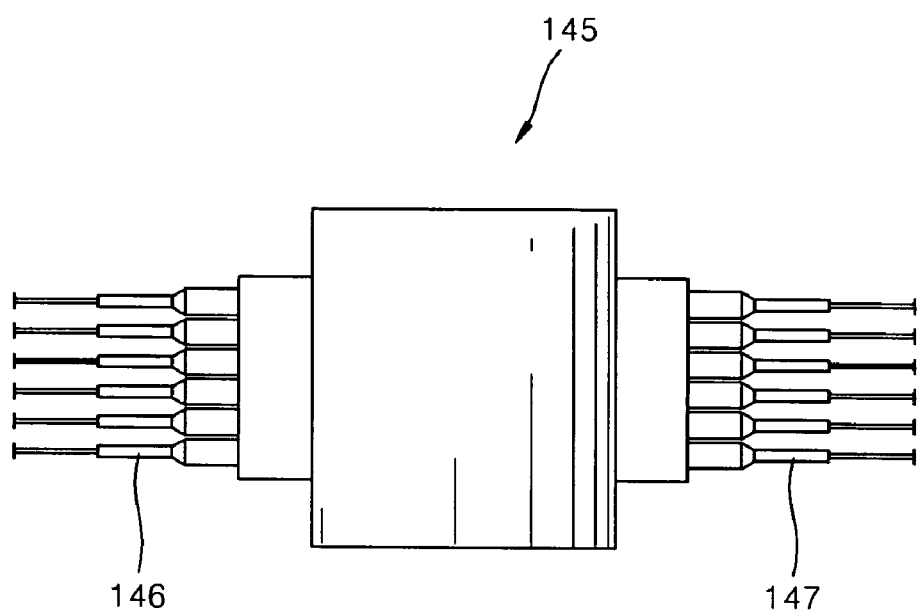
FIG. 5 illustrates a schematic perspective view of a mercury contact slip ring of the testing system in FIG. 1.

The central controller 140 and the board mounting portion 120 may be connected to each other by at least one mercury contact slip ring 145 having first conductors 147 and second conductors 146, as illustrated in FIGS. 2 and 5. Such a connection is advantageous, because it may minimize twisting of the conductors. For example, use of first conductors 147 as a single direct link between the fixed central controller 140 and the board mounting portion 120, may twist first conductors 147 when the board mounting portion 120 rotates. Such twisting of conductors may be minimized by employing second conductors 146 between the central controller 140 and the first conductors 147, such that a mercury contact slip ring 145 is placed between the first and second conductors 146 and 147, as illustrated in FIG. 5. Accordingly, even when the first conductors 147 are rotated, the second conductors 146 may remain stationary.

The first conductors 147 and the second conductors 146 may be electrically connected via the mercury contact slip ring 145. In particular, the first conductors 147 and the second conductors 146 may be in continuous contact with sliding liquid mercury, such that the electrical connectivity between the first conductors 147 and the second conductors 146 may be maintained.

The mercury contact slip ring 145 may be located at any location within the system 100 selected by those skilled in the art. For example, the mercury contact slip ring 145 may be placed between the central controller 140 and the board mounting portion 120, as illustrated in FIG. 2, between the board mounting portion 120 and other fixed bodies (not shown), around the rotational shaft 135 under the board mounting portion 120, or any other like location. It should be noted that the system 100 may include more than one mercury contact slip ring 145, and the number may be based on system components and specifications as may be understood by those skilled in the art.

The mercury contact slip ring 145 may be of any structure and characteristic known to those skilled in the art. The mercury contact slip ring 145 may have a low contact resistance with respect to the first and second conductors 147 and 146, and it may have a semi-permanent life span, requiring little or no maintenance.

Figure 4:
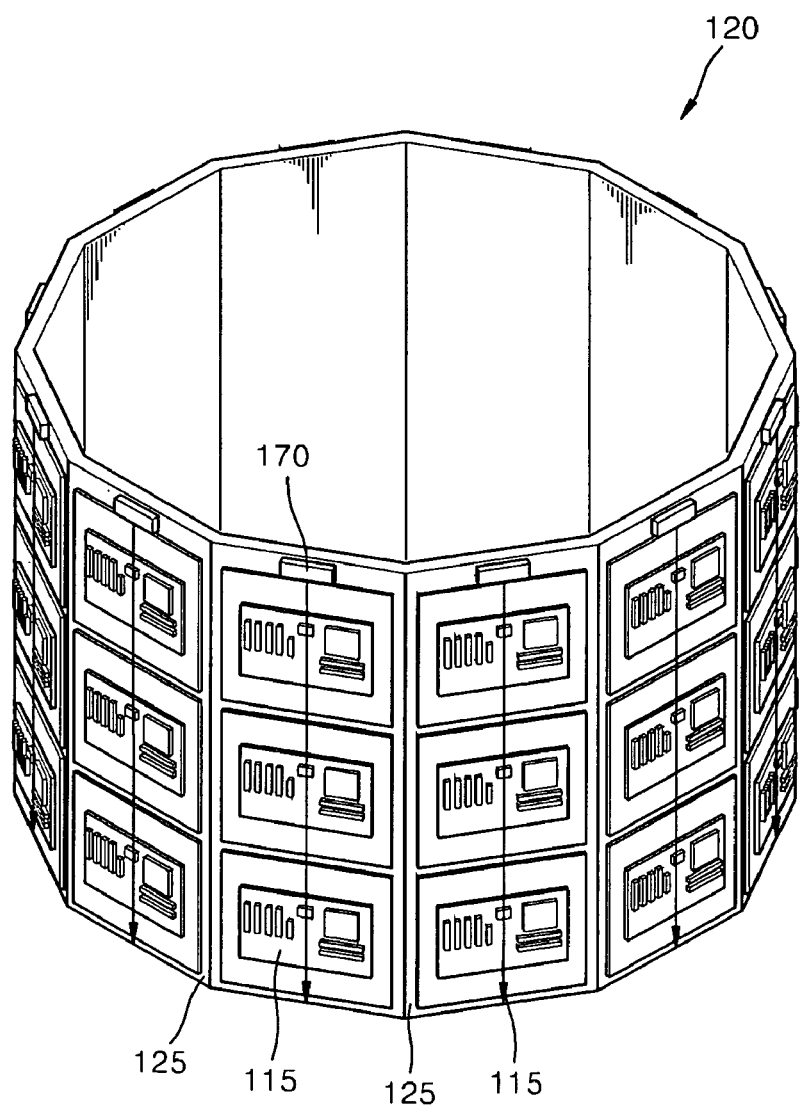

The system 100 of the present invention may further include a plurality of hot air blowers 170 attached to the board mounting portion 120, as illustrated in FIG. 4. The hot air blowers 170 may keep maintain the circuit boards 115 at a uniform temperature, thereby improving the reliability of a temperature-dependent test. The plurality of hot air blowers 170 may correspond to the mounting surfaces 125, e.g., one hot air blower 170 may be mounted on each mounting surface 125.

Each hot air blower 170 may include a heating unit (not shown) and a ventilating portion (not shown). Heat generated by the heating unit may be transferred onto the circuit boards 115 through the ventilating portion. The hot air blower 170 may have a structure that is commonly known to those skilled in the art.

According to the present invention, memory modules may be loaded or unloaded into the testing system 100 manually or mechanically. For example, as shown in FIG. 2, the testing system 100 may also include a robotic arm 155 between the input/output portion 112 and the board mounting portion 120 to move the memory modules. The robotic arm 155 may automatically load the memory modules through the loading portion 160 into the board mounting portion 120 and unload the memory modules from the board mounting portion 120 through the unloading portion 165.

Accordingly, the robotic arm 155 may improve the efficiency of the testing system 100 by minimizing the operator's tasks and the time tested memory modules remain in a standby state in the board mounting portion 120 when an operator fails to recognize tested memory modules. This may improve task efficiency in testing the memory modules. As such, only one operator may be required to operate testing system 100, thereby increasing manpower efficiency.

The system 100 may further include at least one power supply (not shown) to operate the board mounting portion 120 and a storage medium (not shown) such as a hard disk; both of which may be connected to the circuit boards 115. The hard disk may store a test program for testing the memory modules and an operating system for circuit boards 115. When the test program is modified, the hard disk may download an updated test program from the central controller 140. A power supply and a hard disk may be attached to the rear side of each circuit board 115 or to its central processing unit. As such, the circuit board 115, the power supply and the hard disk may form a separate computer system. Alternatively, the power supply and the hard disk may be connected to the circuit boards 115 by other methods known to those skilled in the art, e.g., one power supply and hard disk may be connected to a plurality of circuit boards 115.

According to another aspect of the present invention, an exemplary method of operating the testing system 100 is described below with reference to FIGS. 1-2. Memory modules may be tested by using circuit boards 115. Each memory module may be integrated into a circuit board 115, and, subsequently, the circuit board 115 may be mounted onto a mounting surface 125 of the board mounting portion 120. The loading of the memory modules to be tested may be done through loading portion 160 manually by the operator or mechanically by robotic arm 155. The mounting portion 120 may be rotated to fill additional mounting surfaces 125. When the system is loaded, an operator may perform the memory module testing via the central controller 140. The testing may be done in stages as well. In particular, if memory modules are loaded into one mounting surface 125, the mounting surface 125 may be immediately tested. That is, when the board mounting portion 120 is rotated, memory modules can be sequentially loaded and tested on a stage by stage basis.

Once the testing is complete, the tested memory modules may be removed from the board mounting portion 120 through the unloading portion 165. When the test is sequentially completed on a stage by stage basis, the memory modules can be unloaded into the unloading portion 165 in the reverse order of loading. The unloading portion 165 may be divided into a plurality of blocks to classify the modules into good modules and bad modules. Accordingly, upon unloading, a determination may be made as to whether the memory modules are defective by referring to the test result indicator 150. Defective memory modules may be unloaded separately.

Another exemplary embodiment of the present invention, i.e., system 200 for testing memory modules, will be described with reference to schematics of perspective and planar views illustrated in FIGS. 6-9.

The testing system 200 of the present invention may include a board mounting portion 220 with a plurality of mounting surfaces 225, whereas at least one circuit board 215 may be mounted on each mounting surface 225.

Figure 6:
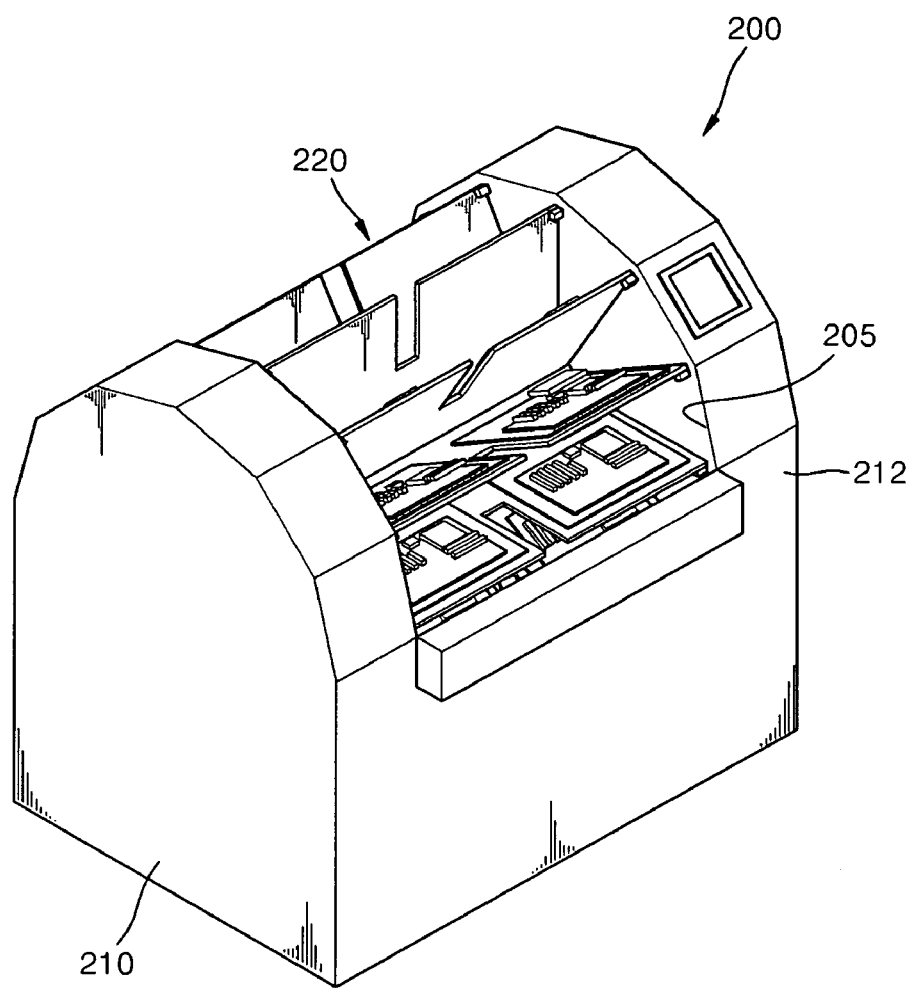
FIG. 6 illustrates a schematic perspective view of a system for testing memory modules according to another embodiment of the present invention.
Figure 7:
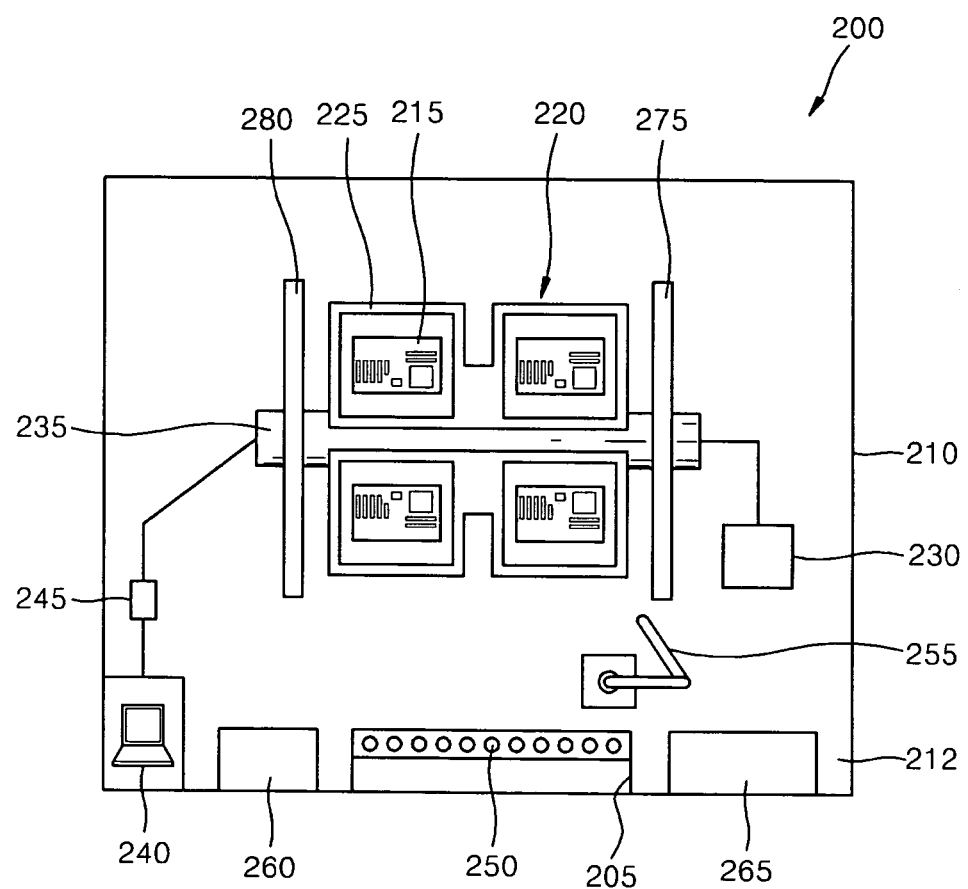
FIG. 7 illustrates a schematic plan view of the testing system of FIG. 6.
Figure 8:
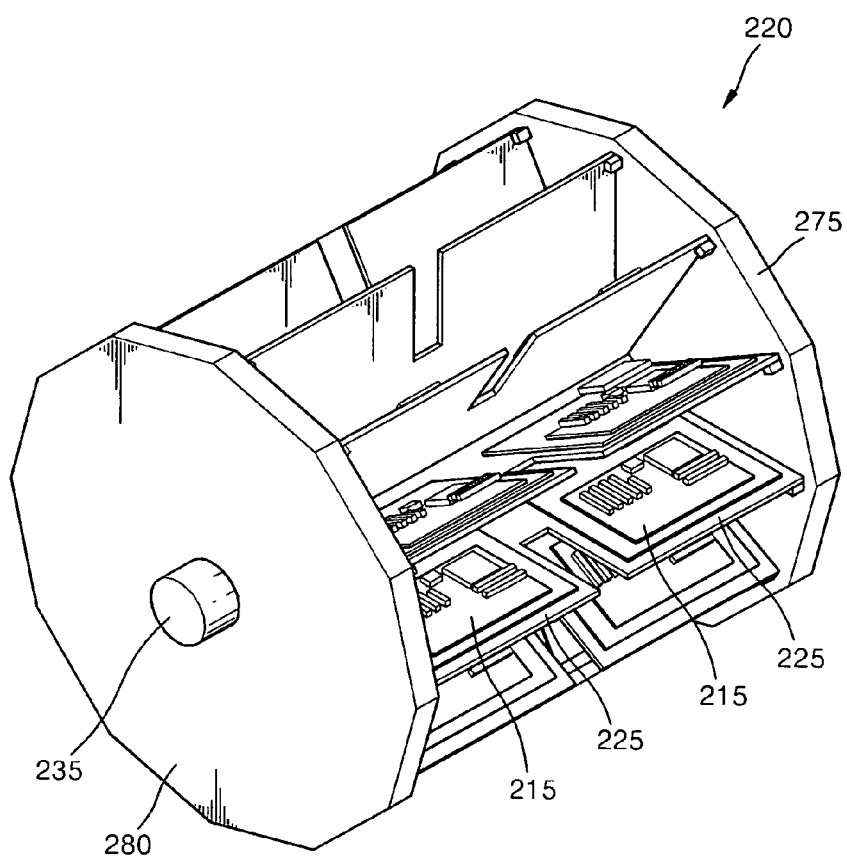
FIGS. 8 and 9 illustrate schematic perspective views of a board mounting portion of the testing system of FIG. 6.

The testing system 200 may also include a loading portion 260 that may be used for depositing memory modules to be tested, an unloading portion 265 that may be used for depositing tested memory modules, a central controller 240 for controlling the circuit boards, a rotational motor 230 to rotate the board mounting portion 220, a rotational shaft 235 coupled to the rotational motor 230, and a display window 205 that may display at least one mounting surface 225. The display window 205, the loading portion 260, and the unloading portion 265 may be referred collectively hereinafter as the input/output portion 212 of system 200. A chamber 210 may enclose all the components included in testing system 200, while the front section of chamber 210 may include the input/output portion 212, as illustrated in FIGS. 6-7.

The input/output portion 212 may further include a test result indicator 250 to indicate tested memory modules for the operator. The test result indicator 250 may correspond either to the memory modules or to the mounting surfaces 225, e.g., test result indicator 250 may be electrically connected either to each circuit board 215 or to each mounting surface 225, by any means known in the art, e.g., a plurality of light emitting diodes (LEDs).

Figure 9:
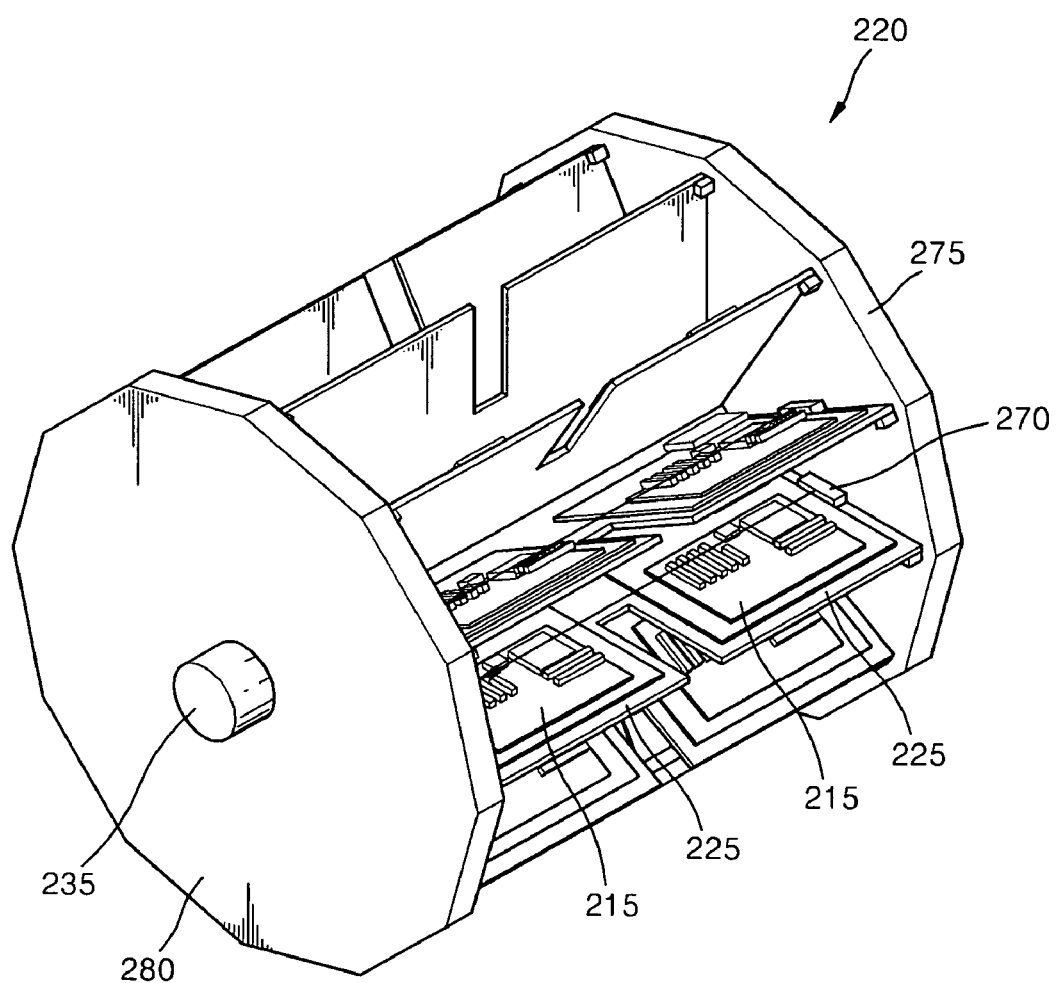

The testing system 200 may also include a power supply (not shown) and a storage medium (not shown), e.g., a hard disk, for the board mounting portion 220, a plurality of hot air blowers 270, as illustrated in FIG. 9, at least one mercury contact slip ring 245, and a robotic arm 255 for moving memory modules.

It is noted that the particular elements that may be included in the embodiment illustrated in FIGS. 6-9, their operation and structure may be similar to the description provided previously with respect to the testing system illustrated in FIGS. 1-5. Accordingly, only details that may be distinguishable from the previous embodiment will be described in detail hereinafter, and details and descriptions that may be found in both embodiments of the testing systems illustrated in FIGS. 1-9 may not be repeated.

As illustrated in FIGS. 6-7, system 200 may include a board mounting portion 220 having a different structure as compared to the board mounting structure 120 of system 100 illustrated in FIGS. 1-5. Board mounting portion 220 may have a rotary structure in which a plurality of mounting surfaces 225 may be positioned at different planes and arranged radially around the rotational shaft 235, e.g., one side of each mounting surface 225 may be connected to the rotational shaft 235. Each mounting surface 225 may include at least one circuit board 215. Preferably, each mounting surface 225 may include at least two circuit boards 215.

The rotational shaft 235 may be disposed horizontally, i.e., parallel to the surface that chamber 210 is placed on, inside chamber 210, and may be supported by first and second supports 275 and 280. As the rotational shaft 235 is rotated, the mounting surfaces 225 may rotate up and down and sequentially display to an operator (not shown) through a display window 205 of chamber 210 the circuit boards 215 mounted on each mounting surface 225. It should be noted that when a mounting surface 225 is displayed to an operator, all the circuit boards 215 loaded threon may be displayed to the operator at a time. Accordingly, the operator can access the plurality of mounting surfaces 225 without moving, thereby improving task efficiency.

EXAMPLES

In Example 1, a testing system according to an embodiment of the present invention is constructed. A board mounting portion is assembled of 12 mounting surfaces around a rotational shaft to form a dodecagonal tower. Each mounting surface of Example 1 is constructed to include three circuit boards, i.e., each mounting surface is capable of holding three memory modules for testing. Accordingly, the testing system in Example 1 is capable of testing thirty-six memory modules at a time.

In Comparative Example 1, a conventional testing device capable of testing a plurality of twenty-four memory modules at a time is used.

A comparison between Example 1 and Comparative Example 1 illustrates that a testing system of the present invention may provide an increase of 43% in space saving and number of memory modules tested simultaneously, as compared to known conventional devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A system for testing memory modules, comprising:
   a board mounting portion including a plurality of mounting surfaces positioned at different planes and connected around an axis to form a rotatable structure, each mounting surface including at least one circuit board, the circuit board being configured to receive at least one memory module and to test the at least one memory module;
   an input/output portion;
   a rotational motor coupled to a rotational shaft for rotating the rotatable structure; and
   a central controller electrically connected to the circuit boards.

2. The system as claimed in claim 1, wherein the rotatable structure is a polyhedral tower, the mounting surfaces defining faces of the polyhedral tower.

3. The system as claimed in claim 2, wherein the axis is perpendicular to a surface the system is placed on, the axis being a rotational axis of the polyhedral tower.

4. The system as claimed in claim 2, wherein each mounting surface is directly connected to two adjacent mounting surfaces, and the polyhedral tower is any one of a hexahedron, an octahedron, a decahedron, or a prism.

5. The system as claimed in claim 2, wherein each mounting surface comprises three circuit boards.

6. The system as claimed in claim 1, wherein the mounting surfaces are connected radially around the axis to define the rotatable structure. each mounting surface being radial with respect to the axis, and the axis being a rotational axis of the rotatable structure.

7. The system as claimed in claim 6, wherein the axis is parallel to a surface the system is placed on.

8. The system as claimed in claim 6, wherein each mounting surface comprises two circuit boards.

9. The system as claimed in claim 1, wherein the input/output portion comprises a test result indicator electrically connected to the central controller.

10. The system as claimed in claim 1, wherein the input/output portion comprises a loading portion and an unloading portion, the loading and unloading portions being stationary with respect to a constant reference point on a surface supporting the board mounting portion.

11. The system as claimed in claim 1, wherein the rotational shaft extends along the axis, the axis defining a rotational axis of the rotatable structure.

12. The system as claimed in claim 1, wherein the central controller and the circuit boards are electrically connected via at least one mercury contact slip ring.

13. The system as claimed in claim 1, further comprising a plurality of hot air blowers.

14. The system as claimed in claim 13, wherein each hot air blower is coupled to one of the plurality of mounting surfaces.

15. The system as claimed in claim 1, further comprising a robotic arm for moving memory modules between the input/output portion and the board mounting portion, the robotic arm being configured to transfer the memory modules from the input/output portion directly to the board mounting portion.

16. The system as claimed in claim 1, further comprising a display window formed in the input/output portion, the display window is capable of displaying at least one mounting surface.

17. The system as claimed in claim 16, wherein the rotatable structure is capable of sequentially displaying each of the plurality of the mounting surfaces through the display window.

18. The system as claimed in claim 1, wherein the central controller is electrically connected to the board mounting portion, the electrical connection between the board mounting portion and central controller being continuous throughout operation of the system.

19. The system as claimed in claim 1, wherein the axis of the rotatable structure is a rotational axis of the rotatable structure, a longitudinal side of each of the mounting surfaces extending in parallel to the rotational axis.

* * * * *